(12) United States Patent
Zeng

(10) Patent No.: US 10,048,553 B2
(45) Date of Patent: Aug. 14, 2018

(54) BOA LIQUID CRYSTAL DISPLAY PANEL AND MANUFACTURING METHOD THEREOF

(71) Applicant: Shenzhen China Star Optoelectronics Technology Co., Ltd., Shenzhen (CN)

(72) Inventor: Mian Zeng, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 104 days.

(21) Appl. No.: 14/778,085

(22) PCT Filed: Aug. 21, 2015

(86) PCT No.: PCT/CN2015/087724
§ 371 (c)(1),
(2) Date: Sep. 18, 2015

(87) PCT Pub. No.: WO2017/012164
PCT Pub. Date: Jan. 26, 2017

(65) Prior Publication Data
US 2017/0023836 A1    Jan. 26, 2017

(30) Foreign Application Priority Data

Jul. 20, 2015   (CN) .......................... 2015 1 0427277

(51) Int. Cl.
*G02F 1/1335*    (2006.01)
*G02F 1/1362*    (2006.01)
(Continued)

(52) U.S. Cl.
CPC ...... *G02F 1/136209* (2013.01); *G02F 1/1341* (2013.01); *G02F 1/1368* (2013.01);
(Continued)

(58) Field of Classification Search
CPC ... H01L 29/4908; H01L 29/45; H01L 27/124; H01L 27/1262; H01L 27/1288; G02F 1/136209
See application file for complete search history.

(56) References Cited

U.S. PATENT DOCUMENTS 5,966,193 A * 10/1999 Zhang ................. H01L 27/1255
349/110
6,002,463 A * 12/1999 Fujikawa .......... G02F 1/136209
349/110
(Continued)

*Primary Examiner* — James Dudek
(74) *Attorney, Agent, or Firm* — Leong C. Lei

(57) ABSTRACT

The present invention provides a BOA liquid crystal display panel and a manufacturing method thereof. The BOA liquid crystal display panel is structured to have a TFT (T) entirely located on a first black matrix (12) and further, a second black matrix (17) is arranged between the TFT (T) and the passivation protection layer (18) such that the second black matrix (17) and the first black matrix (12) completely enclose the TFT (T) to block light emitting from a backlight module located under an array substrate (1) in a direction toward an active layer (14) and also to block reflecting light irradiating the active layer (14) from lateral sides and a top side to better prevent light irradiating the active layer of the TFT for preventing photo leakage current, ensuring stable performance of the TFT device, and improving image displaying quality. The manufacturing method of the BOA liquid crystal display panel of the present invention can overcome the issue of photo leakage current induced by backlighting irradiating the active layer of the TFT 的 the active layer and also helps reduce the number of masks used, shorten the manufacturing time, and increase the manufacturing efficiency.

7 Claims, 10 Drawing Sheets

(51) Int. Cl.
*G02F 1/1341* (2006.01)
*G02F 1/1343* (2006.01)
*G02F 1/1368* (2006.01)
*H01L 27/12* (2006.01)
*H01L 29/45* (2006.01)
*H01L 29/49* (2006.01)
*H01L 29/786* (2006.01)
*G02F 1/1333* (2006.01)

(52) U.S. Cl.
CPC .... G02F 1/13439 (2013.01); G02F 1/133516 (2013.01); G02F 1/136227 (2013.01); H01L 27/124 (2013.01); H01L 27/1262 (2013.01); H01L 27/1288 (2013.01); H01L 29/45 (2013.01); H01L 29/4908 (2013.01); H01L 29/78633 (2013.01); *G02F 1/133345* (2013.01); *G02F 2001/133302* (2013.01); *G02F 2201/121* (2013.01); *G02F 2201/123* (2013.01)

(56) References Cited

U.S. PATENT DOCUMENTS

2012/0249936 A1* 10/2012 Zi ................... H01L 27/1288
  349/106
2016/0062199 A1* 3/2016 Zhao ................. G02F 1/13439
  257/72

* cited by examiner

Step 1: providing a lower substrate (11), coating a layer of black resin on the lower substrate (11), using a first mask to subject the black resin to patterning treatment so as to form a first black matrix (12);

Step 2: sputtering-coating or vapor-depositing a metal film on the first black matrix (12) and the lower substrate (11) and using a second mask to subject the metal film to patterning treatment so as to form source/drain terminals (13) located on the first black matrix (12);

Step 3: successively depositing a semiconductor film and an insulation film on the source/drain terminals (13) and the first black matrix (12) through chemical vapor deposition and then sputtering-coating or vapor-depositing another metal film, and using a third mask to simultaneously subject said another metal film, the insulation film, and the semiconductor film to patterning treatment so as to form an active layer (14), a gate insulation layer (15), and a gate terminal (16) that are sequentially formed on the source/drain terminals (13) and the first black matrix (12);
wherein the source/drain terminals (13), the active layer (14), the gate insulation layer (15), and the gate terminal (16) collectively constitute a TFT (T);

Step 4: depositing a passivation protection layer (18) on the TFT (T) and the lower substrate (11) through chemical vapor deposition and using a fourth mask to subject the passivation protection layer (18) to patterning treatment to form a via (181) extending through the passivation protection layer (18) so as to expose a portion of the source/drain terminals (13);

Step 5: depositing an ITO film on the passivation protection layer (18) and using a fifth mask to subject the ITO film to patterning treatment so as to form a pixel electrode (19), in such a way that the pixel electrode (19) is set in contact with the source/drain terminals (13) through the via (181) thereby completing the manufacture of the array substrate (1);

Step 6: providing an upper substrate (21) and sequentially forming a color resist layer (22) and a common electrode layer (23) on the upper substrate (21) to complete the manufacture of the CF substrate (2); and
then, laminating the array substrate (1) and the CF substrate (2) together, filling liquid crystal molecules between the array substrate (1) and the CF substrate (2) to form a liquid crystal layer (3), and subjecting the array substrate (1) and the CF substrate (2) to packaging.

Fig. 4

BOA LIQUID CRYSTAL DISPLAY PANEL AND MANUFACTURING METHOD THEREOF

BACKGROUND OF THE INVENTION

1. Field of the Invention

The present invention relates to the field of display technology, and in particular to a BOA (Black Matrix on Array) liquid crystal display panel and a manufacturing method thereof.

2. The Related Arts

With the development of the display technology, liquid crystal displays (LCDs) have been widely used in various consumer electronic products, such as mobile phones, televisions, personal digital assistants (PDAs), digital cameras, notebook computers, and desktop computers, due to a variety of advantages, such as high image quality, saving power, thin body device, and wide applications, and are now the main stream of display devices.

Most of the liquid crystal displays that are currently available in the market are backlighting liquid crystal displays, which comprise a backlight module and a liquid crystal display panel mounted to the backlight module.

A liquid crystal display panel used in a thin-film transistor liquid crystal display (TFT-LCD) is generally made up of a color filter (CF) substrate, a thin-film transistor (TFT) array substrate, and a liquid crystal layer arranged between the two substrates and the principle of operation is that a driving voltage is applied to the two substrates to control rotation of the liquid crystal molecules of the liquid crystal layer in order to refract out light emitting from the backlight module to generate an image.

The TFT, which is an important constituent part of an array substrate, is an insulated-gate field effect transistor made of a semiconductor film and comprising an active layer that is extremely sensitive to light so that even a small variation of light intensity would greatly affect the characteristics of a TFT device. When conducted on, a TFT would generate a photo leakage current (Photo Ioff) in the active layer between a source terminal and a drain terminal due to irradiation of faint light. When photo Ioff increases, the characteristics of the TFT device gets deteriorated, leading to the problems of cross-talking, flickering, and residual image so as to greatly affect the quality of displayed images.

As shown in FIG. 1, a conventional liquid crystal display panel comprises an array substrate 100 and a CF substrate 200 that are opposite to each other and a liquid crystal layer 300 interposed therebetween. Formed, sequentially from bottom to top, on a surface of the array substrate 100 are a lower substrate 110, a gate terminal 120, a gate insulation layer 130, an active layer 140, source/drain terminals 150, a passivation protection layer 160, and a pixel electrode 170, wherein the gate terminal 120, the gate insulation layer 130, the active layer 140, and the source/drain terminals 150 collectively constitute a TFT; and arranged on a surface of the CF substrate 200 are an upper substrate 210, a black matrix (BM) 220, a color resist layer 230, and a common electrode 240. The black matrix 220 that is light impermeable is arranged on one surface of the CF substrate 200, this being the so-called "BM On CF" and the black matrix 220 is located above and corresponds to the TFT, a gate line, and a data line to shield light leaking at the sites of the TFT, the gate line, and the data line in order to maintain displaying quality.

However, such a "BM On CF" liquid crystal display panel does not shield light emitting from a backlight module that is located under the array substrate 100 toward the active layer 140 and thus, inevitably, a photo leakage current would be induced and the performance of the TFT device and the quality of a displayed image would be affected. Further, in an operation of laminating the array substrate 100 and the CF substrate 200, precise alignment of the black matrix 220 with respect to the TFT, the gate line, and the data line is hard to achieve. Further, the number of masks used in manufacturing the liquid crystal display panel is great and the manufacturing time is long so that the manufacturing cost is high.

SUMMARY OF THE INVENTION

An object of the present invention is to provide a BOA (Black Matrix on Array) liquid crystal display panel, which effectively overcomes the issue of photo leakage current induced by backlighting irradiating an active layer of a thin-film transistor (TFT), ensures stable performance of the TFT device, and improves image displaying quality.

Another object of the present invention is to provide a manufacturing method of a BOA liquid crystal display panel, which, on the one hand, effectively overcomes the issue of photo leakage current induced by backlighting irradiating an active layer of a thin-film transistor (TFT), ensures stable performance of the TFT device, and improves image displaying quality and, on the other hand, reduces the number of masks used, shortens the manufacturing time, and increases the manufacturing efficiency.

To achieve the above objects, the present invention provides a BOA liquid crystal display panel, which comprises an array substrate and a color filter (CF) substrate opposite to each other and a liquid crystal layer interposed between the array substrate and the CF substrate.

The array substrate comprises a lower substrate, a first black matrix formed on the lower substrate, a TFT that is entirely located on the first black matrix, a passivation protection layer covering the TFT, the first black matrix, and the lower substrate, and a pixel electrode formed on the passivation protection layer and in contact with source/drain terminals of the TFT.

The CF substrate comprises an upper substrate, a color resist layer formed on a surface of the upper substrate that faces the array substrate, and a common electrode covering the color resist layer and the upper substrate.

The BOA liquid crystal display panel may further comprise a second black matrix formed between the TFT and the passivation protection layer such that the second black matrix and the first black matrix completely enclose the TFT.

The TFT is of a top gate structure and comprises the source/drain terminals, an active layer, a gate insulation layer, and a gate terminal that are formed, sequentially from bottom to top, on the first black matrix.

Optionally, the pixel electrode is in contact with the source/drain terminals through a via extending through the passivation protection layer.

Optionally, the pixel electrode is in contact with the source/drain terminals through a via extending through the passivation protection layer and the second black matrix.

The present invention also provides a BOA liquid crystal display panel, which comprises an array substrate and a CF substrate opposite to each other and a liquid crystal layer interposed between the array substrate and the CF substrate, wherein the array substrate comprises a lower substrate, a first black matrix formed on the lower substrate, a TFT that is entirely located on the first black matrix, a passivation protection layer covering the TFT, the first black matrix, and the lower substrate, and a pixel electrode formed on the passivation protection layer and in contact with source/drain terminals of the TFT, and the CF substrate comprises an upper substrate, a color resist layer formed on a surface of the upper substrate that faces the array substrate, and a common electrode covering the color resist layer and the upper substrate; and further comprising a second black matrix formed between the TFT and the passivation protection layer such that the second black matrix and the first black matrix completely enclose the TFT;

wherein the TFT is of a top gate structure and comprises the source/drain terminals, an active layer, a gate insulation layer, and a gate terminal that are formed, sequentially from bottom to top, on the first black matrix; and wherein the pixel electrode is in contact with the source/drain terminals through a via extending through the passivation protection layer and the second black matrix.

The present invention further provides a manufacturing method of a BOA liquid crystal display panel, which comprises, after formation of a first black matrix on a lower substrate that is located at one side of an array substrate, forming a TFT that is entirely located on the first black matrix; and forming a color resist layer and a common electrode on a surface of a CF substrate.

A second black matrix may be further formed on the TFT such that the second black matrix and the first black matrix completely enclose the TFT, and the first black matrix and the second black matrix are formed by using the same mask.

Optionally, the manufacturing method of the BOA liquid crystal display panel comprises the following steps:

(1) providing a lower substrate, coating a layer of black resin on the lower substrate, using a first mask to subject the black resin to patterning treatment so as to form the first black matrix;

(2) sputtering-coating or vapor-depositing a metal film on the first black matrix and the lower substrate and using a second mask to subject the metal film to patterning treatment so as to form source/drain terminals located on the first black matrix;

(3) successively depositing a semiconductor film and an insulation film on the source/drain terminals and the first black matrix through chemical vapor deposition and then sputtering-coating or vapor-depositing another metal film, and using a third mask to simultaneously subject said another metal film, the insulation film, and the semiconductor film to patterning treatment so as to form an active layer, a gate insulation layer, and a gate terminal that are sequentially formed on the source/drain terminals and the first black matrix, wherein the source/drain terminals, the active layer, the gate insulation layer, and the gate terminal collectively constitute the TFT;

(4) depositing a passivation protection layer on the TFT and the lower substrate through chemical vapor deposition and using a fourth mask to subject the passivation protection layer to patterning treatment to form a via extending through the passivation protection layer so as to expose a portion of the source/drain terminals;

(5) depositing an indium tin oxide (ITO) film on the passivation protection layer and using a fifth mask to subject the ITO film to patterning treatment so as to form a pixel electrode, in such a way that the pixel electrode is set in contact with the source/drain terminals through the via thereby completing the manufacture of the array substrate; and (6) providing an upper substrate and sequentially forming the color resist layer and the common electrode layer on the upper substrate to complete the manufacture of the CF substrate, and then, laminating the array substrate and the CF substrate together, filling liquid crystal molecules between the array substrate and the CF substrate to form a liquid crystal layer, and subjecting the array substrate and the CF substrate to packaging.

Optionally, the manufacturing method of the BOA liquid crystal display panel comprises the following steps:

(1) providing a lower substrate, coating a layer of black resin on the lower substrate, using a first mask to subject the black resin to patterning treatment so as to form the first black matrix;

(2) sputtering-coating or vapor-depositing a metal film on the first black matrix and the lower substrate and using a second mask to subject the metal film to patterning treatment so as to form source/drain terminals located on the first black matrix;

(3) successively depositing a semiconductor film and an insulation film on the source/drain terminals and the first black matrix through chemical vapor deposition and then sputtering-coating or vapor-depositing another metal film, and using a third mask to simultaneously subject said another metal film, the insulation film, and the semiconductor film to patterning treatment so as to form an active layer, a gate insulation layer, and a gate terminal that are sequentially formed on the source/drain terminals and the first black matrix, wherein the source/drain terminals, the active layer, the gate insulation layer, and the gate terminal constitute the TFT;

(4) coating another layer of black resin on the TFT and the lower substrate and using the first mask to subject said another layer of the black resin to patterning treatment to form the second black matrix such that the second black matrix and the first black matrix completely enclose the TFT;

(5) depositing a passivation protection layer on the second black matrix and the lower substrate through chemical vapor deposition and using a fourth mask to subject the passivation protection layer to patterning treatment to form a via extending through the passivation protection layer and the second black matrix so as to expose a portion of the source/drain terminals;

(6) depositing an ITO film on the passivation protection layer and using a fifth mask to subject the ITO film to patterning treatment so as to form a pixel electrode, in such a way that the pixel electrode is set in contact with the source/drain terminals through the via thereby completing the manufacture of the array substrate; and (7) providing an upper substrate and sequentially forming a color resist layer and a common electrode layer on the upper substrate to complete the manufacture of the CF substrate, and then, laminating the array substrate and the CF substrate together, filling liquid crystal molecules between the array substrate and the CF substrate to form a liquid crystal layer, and subjecting the array substrate and the CF substrate to packaging.

The gate terminal and the source/drain terminals are each formed of a material comprising one of molybdenum, titanium, aluminum, copper, and nickel, or a stacked combination of multiple ones thereof and the gate insulation layer and the passivation protection layer are each formed of a material of silicon oxides, silicon nitrides, or a combination thereof.

The efficacy of the present invention is that the present invention provides a BOA liquid crystal display panel, in which a TFT is entirely located on a first black matrix so that the first black matrix blocks light emitting from a backlight module that is located under an array substrate in a direction toward an active layer thereby effectively overcoming the issue of photo leakage current induced by light irradiating the active layer of the TFT. Further, a second black matrix is formed between the TFT and a passivation protection layer such that the second black matrix and the first black matrix completely enclose the TFT to block light emitting from the backlight module that is located under the array substrate in a direction toward the active layer and also block reflecting light irradiating the active layer from lateral sides and top side to thereby better prevent light irradiating the active layer of the TFT for preventing photo leakage current, ensuring stable performance of the TFT device, and improving image displaying quality. The present invention provides a manufacturing method of a BOA liquid crystal display panel, in which after a first black matrix is formed on a lower substrate that is on one side of an array substrate, a TFT is formed entirely on the first black matrix so that the first black matrix blocks light emitting from a backlight module that is located under the array substrate in a direction toward an active layer thereby effectively overcoming the issue of photo leakage current induced by light irradiating the active layer of the TFT, and further, a second black matrix is formed on the TFT so that the second black matrix and the first black matrix completely enclose the TFT to block light emitting from the backlight module that is located under the array substrate in a direction toward the active layer and also block reflecting light irradiating the active layer from lateral sides and top side to thereby better prevent light irradiating the active layer of the TFT for preventing photo leakage current, ensuring stable performance of the TFT device, and improving image displaying quality; and further, the active layer, the gate insulation layer, and the gate terminal of the TFT are formed by using the same mask and the first black matrix and the second black matrix are formed through using the same mask so that the number of masks used is reduced, the manufacturing time is shortened, and the manufacturing efficiency is increased.

For better understanding of the features and technical contents of the present invention, reference will be made to the following detailed description of the present invention and the attached drawings. However, the drawings are provided for the purposes of reference and illustration and are not intended to impose limitations to the present invention.

BRIEF DESCRIPTION OF THE DRAWINGS

The technical solution, as well as other beneficial advantages, of the present invention will be apparent from the following detailed description of embodiments of the present invention, with reference to the attached drawing. In the drawing:

FIG. 4 is a flow chart illustrating a manufacturing method of a BOA liquid crystal according to the first embodiment of the present invention;

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 1:
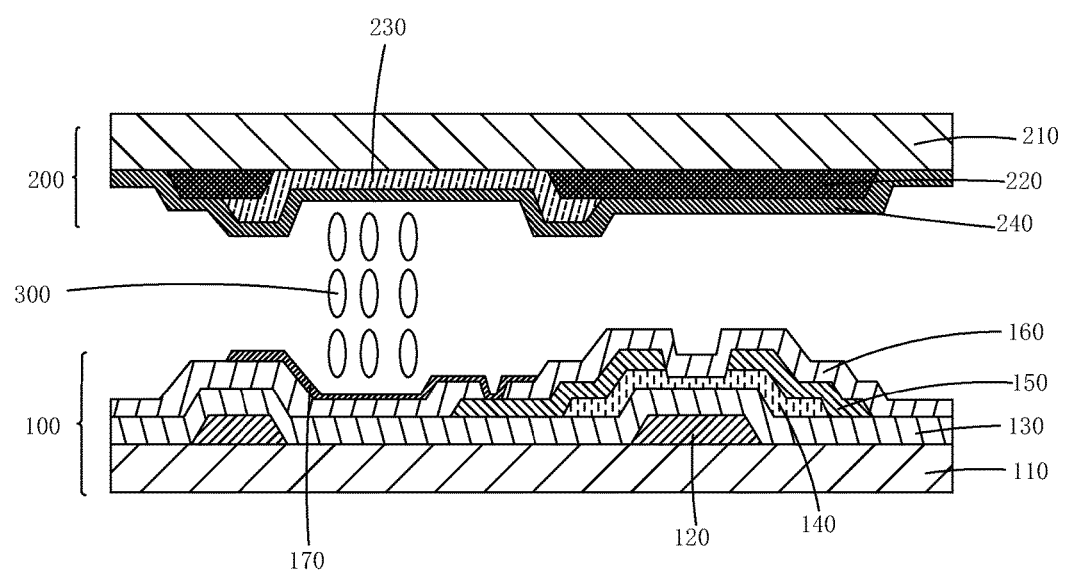
FIG. 1 is a schematic view showing a conventional BM On CF liquid crystal display panel.
Figure 2:
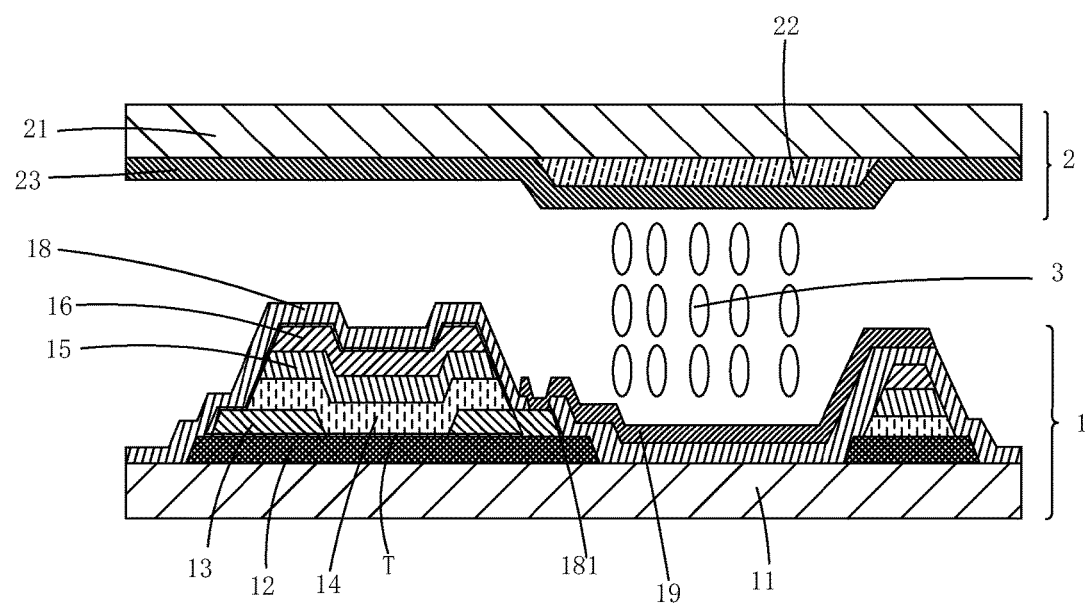
FIG. 2 is a schematic view showing a BOA liquid crystal display panel according to a first embodiment of the present invention.

Firstly, the present invention provides a BOA (BM On Array) liquid crystal display panel. The so-called "BOA" refers to an arrangement in which a black matrix (BM) is set on a surface of an array substrate (BM On Array). Referring to FIG. 2, a BOA liquid crystal display panel according to a first embodiment of the present invention is shown, comprising an array substrate 1 and a color filter (CF) substrate 2 opposite to each other and a liquid crystal layer 3 interposed between the array substrate 1 and the CF substrate 2.

The array substrate 1 comprises a lower substrate 11, a first black matrix 12 formed on the lower substrate 11, a thin-film transistor (TFT) T that is entirely located on the first black matrix 12, a passivation protection layer 18 covering the TFT T, the first black matrix 12, and the lower substrate 11, and a pixel electrode 19 formed on the passivation protection layer 18 and in contact with source/drain terminals 13 of the TFT T. The CF substrate 2 comprises an upper substrate 21, a color resist layer 22 formed on a surface of the upper substrate 21 that faces the array substrate 1, and a common electrode 23 covering the color resist layer 22 and the upper substrate 21.

Preferably, the TFT T is of a top gate structure and comprises the source/drain terminals 13, an active layer 14, a gate insulation layer 15, and a gate terminal 16 that are formed, sequentially from bottom to top, on the first black matrix 12. The pixel electrode 19 is set in contact with the source/drain terminals 13 through a via 181 extending through the passivation protection layer 18.

Specifically, the gate terminal 16 and the source/drain terminals 13 are each formed of a material comprising one of molybdenum (Mo), titanium (Ti), aluminum (Al), copper (Cu), and nickel (Ni), or a stacked combination of multiple ones thereof. The gate insulation layer 15 and the passivation protection layer 18 are each formed of a material of silicon oxide (SiOx), silicon nitride (SiNx), or a combination thereof. The pixel electrode 19 is formed of a material of indium tin oxide (ITO).

The first embodiment is structured in such a way that the entirety of the TFT T is arranged and located on the first black matrix 12. The first black matrix 12 helps block light emitting from a backlight module located under the array substrate in a direction toward the active layer 14 so as to effectively overcome the issue of photo leakage current induced by light irradiating the active layer 14 of the TFT T and thus ensure the stability of performance of the TFT device and improve image displaying quality.

Figure 3:
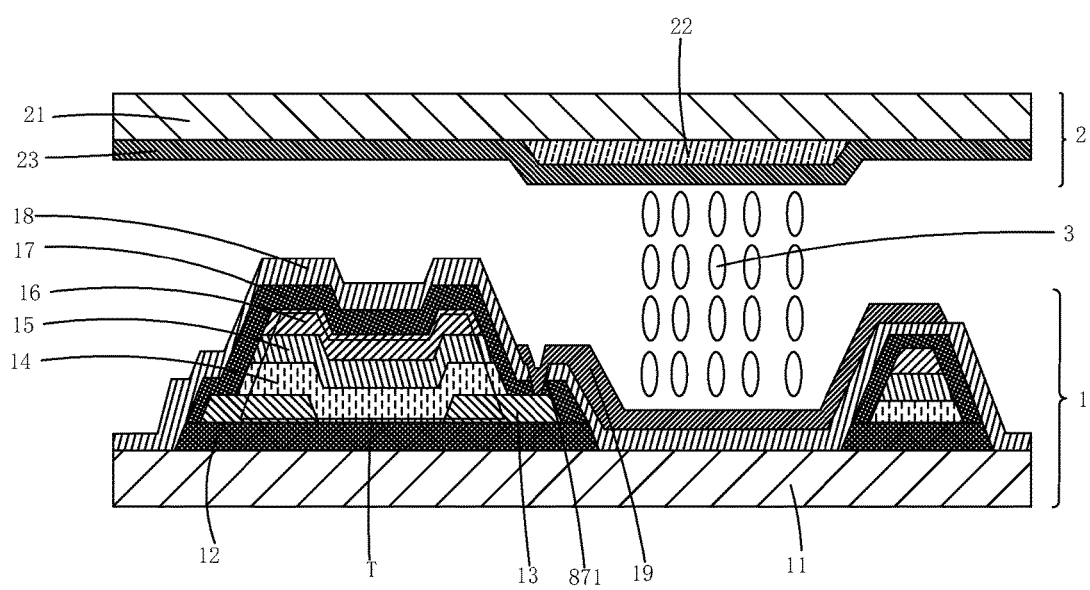
FIG. 3 is a schematic view showing a BOA liquid crystal display panel according to a second embodiment of the present invention.

Referring to FIG. 3, a BOA liquid crystal display panel according to a second embodiment of the present invention is shown, which is different from the first embodiment by further comprising a second black matrix 17 formed between the TFT T and the passivation protection layer 18 such that the second black matrix 17 and the first black matrix 12 completely enclose the TFT T. The pixel electrode 19 is set in contact with the source/drain terminals 13 through a via 871 extending through the passivation protection layer 18 and the second black matrix 17.

The second embodiment is further structured to comprise the second black matrix 17 arranged between the TFT T and the passivation protection layer 18 such that the second black matrix 17 and the first black matrix 12 completely enclose the TFT T to block light emitting from a backlight module located under the array substrate in a direction toward the active layer 14 and also block reflecting light irradiating the active layer 14 from lateral sides and top side to thereby better prevent light irradiating the active layer 14 of the TFT T for preventing photo leakage current, ensuring stable performance of the TFT device, and improving image displaying quality.

Figure 5:
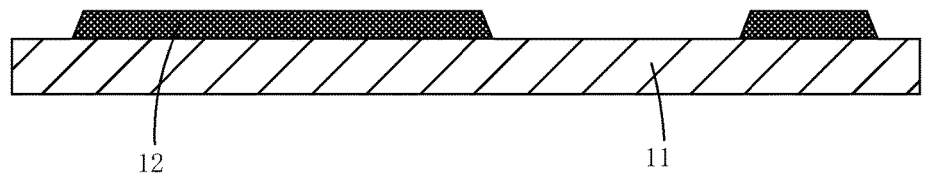
FIG. 5 is a schematic view illustrating a first step of the manufacturing method of the BOA liquid crystal according to the first embodiment of the present invention.

The present invention further provides a manufacturing method of a BOA liquid crystal display panel. Referring to FIG. 4, which is a flow chart illustrating a manufacturing method of a BOA liquid crystal display panel according to a first embodiment of the present invention. The first embodiment corresponds to a process for manufacturing the BOA liquid crystal display panel shown in FIG. 2 and comprises the following steps:

Step 1: as shown in FIG. 5, providing a lower substrate 11, coating a layer of black resin on the lower substrate 11, using a first mask to subject the black resin to patterning treatment so as to form a first black matrix 12.

Specifically, the lower substrate 11 is preferably a glass substrate. The patterning treatment comprises operations of exposure, development, and etching.

Figure 6:
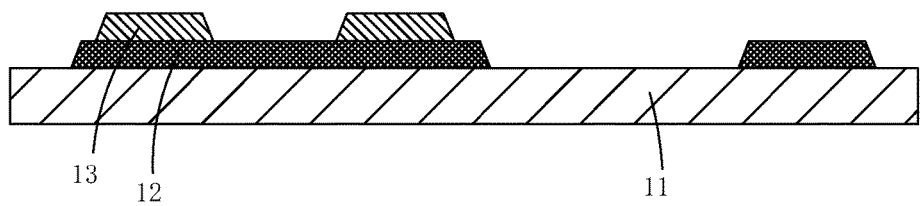
FIG. 6 is a schematic view illustrating a second step of the manufacturing method of the BOA liquid crystal according to the first embodiment of the present invention.

Step 2: as shown in FIG. 6, sputtering-coating or vapor-depositing a metal film on the first black matrix 12 and the lower substrate 11 and using a second mask to subject the metal film to patterning treatment so as to form source/drain terminals 13 located on the first black matrix 12.

Specifically, the metal film, which is the source/drain terminals 13, is formed of a material comprising one of Mo, Ti, Al, Cu, and Ni or a stacked combination of multiple ones thereof. The patterning treatment comprises operations of exposure, development, and wet etching.

Figure 7:
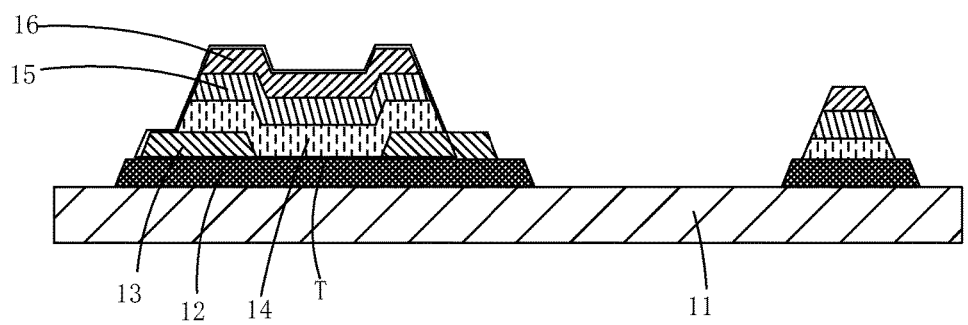
FIG. 7 is a schematic view illustrating a third step of the manufacturing method of the BOA liquid crystal according to the first embodiment of the present invention.

Step 3: as shown in FIG. 7, successively depositing a semiconductor film and an insulation film on the source/drain terminals 13 and the first black matrix 12 through chemical vapor deposition and then sputtering-coating or vapor-depositing another metal film, and using a third mask to simultaneously subject said another metal film, the insulation film, and the semiconductor film to patterning treatment so as to form an active layer 14, a gate insulation layer 15, and a gate terminal 16 that are sequentially formed on the source/drain terminals 13 and the first black matrix 12. The source/drain terminals 13, the active layer 14, the gate insulation layer 15, and the gate terminal 16 collectively constitute a TFT T.

Specifically, the insulation film, which is the gate insulation layer 15, is formed of a material comprising SiOx, SiNx, or a combination thereof. Said anther metal film, which is the gate terminal 16, is formed of a material comprising one of Mo, Ti, Al, Cu, and Ni or a stacked combination of multiple ones thereof. The patterning treatment comprises operations of exposure, development, wet etching, and dry etching.

Figure 8:
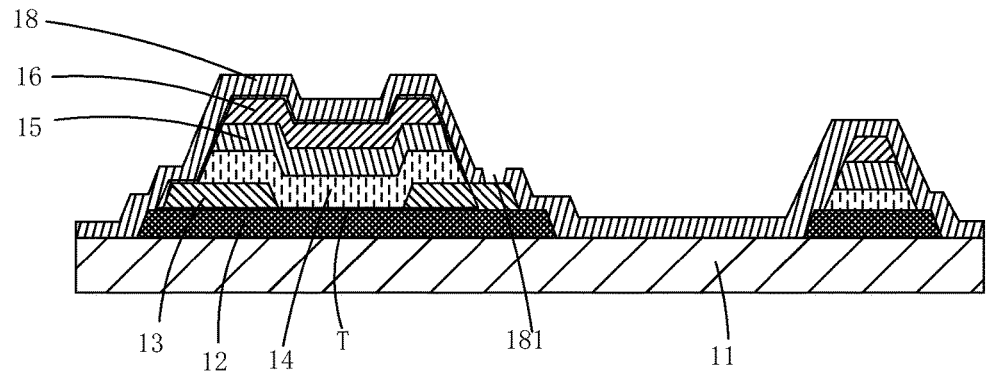
FIG. 8 is a schematic view illustrating a fourth step of the manufacturing method of the BOA liquid crystal according to the first embodiment of the present invention.

Step 4: as shown in FIG. 8, depositing a passivation protection layer 18 on the TFT T and the lower substrate 11 through chemical vapor deposition and using a fourth mask to subject the passivation protection layer 18 to patterning treatment to form a via 181 extending through the passivation protection layer 18 so as to expose a portion of the source/drain terminals 13.

Specifically, the passivation protection layer 18 is formed of a material comprising SiOx, SiNx, or a combination thereof. The patterning treatment comprises operations of exposure, development, and dry etching.

Figure 9:
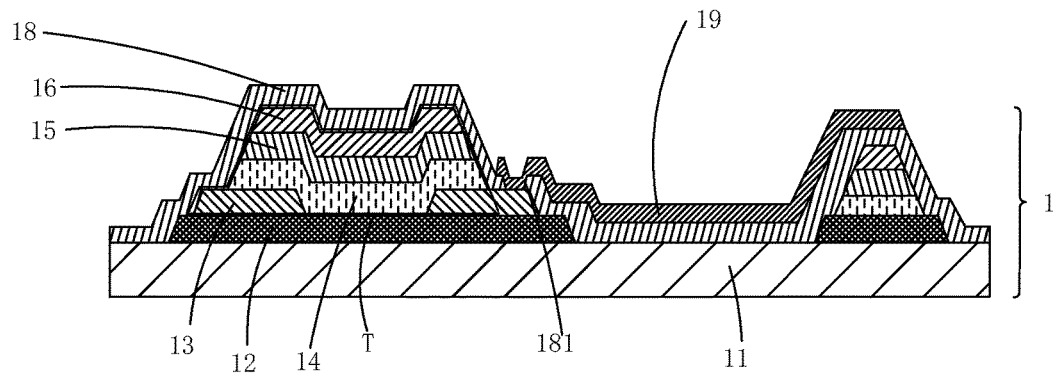
FIG. 9 is a schematic view illustrating a fifth step of the manufacturing method of the BOA liquid crystal according to the first embodiment of the present invention.

Step 5: as shown in FIG. 9, depositing an ITO film on the passivation protection layer 18 and using a fifth mask to subject the ITO film to patterning treatment so as to form a pixel electrode 19, in such a way that the pixel electrode 19 is set in contact with the source/drain terminals 13 through the via 181 thereby completing the manufacture of an array substrate 1.

Specifically, the patterning treatment comprises operations of exposure, development, and etching.

Figure 10:
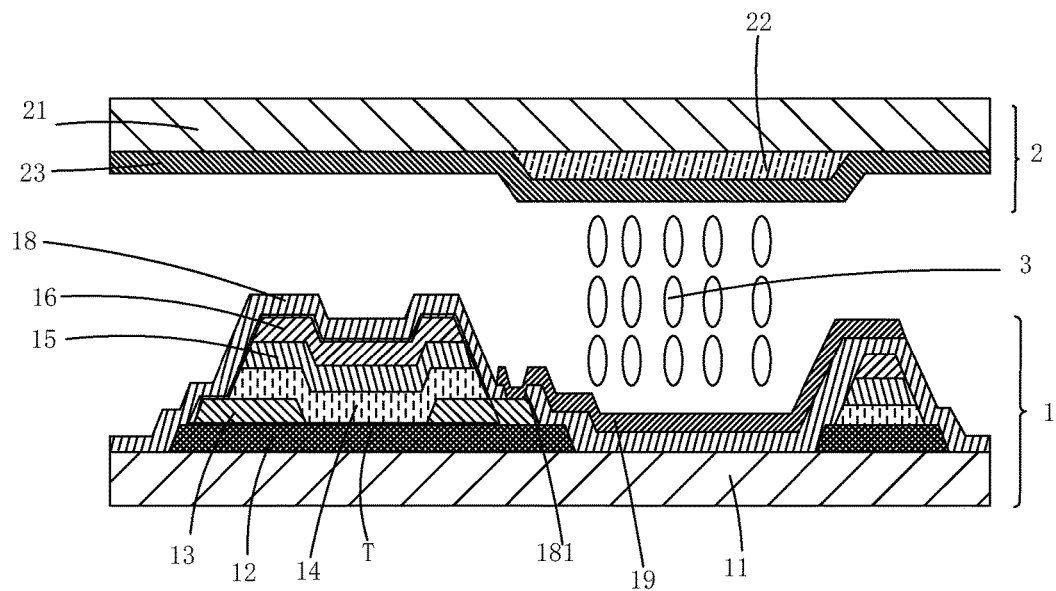
FIG. 10 is a schematic view illustrating a sixth step of the manufacturing method of the BOA liquid crystal according to the first embodiment of the present invention.

Step 6: as shown in FIG. 10, providing an upper substrate 21, sequentially forming a color resist layer 22 and a common electrode layer 23 on the upper substrate 21, and forming a photo spacer (not shown) on the common electrode layer 23 to complete the manufacture of a CF substrate 2; and then, laminating the array substrate 1 and the CF substrate 2 together, filling liquid crystal molecules between the array substrate 1 and the CF substrate 2 to form a liquid crystal layer 3, and subjecting the array substrate 1 and the CF substrate 2 to packaging.

Specifically, the upper substrate 21 is preferably a glass substrate.

In the above-discussed first embodiment of the manufacturing method of a BOA liquid crystal display panel, after the first black matrix 12 is formed on the lower substrate 11 that is on one side of the array substrate 1, the TFT T is formed entirely on the first black matrix 12 so that the first black matrix 12 blocks light emitting from the backlight module that is located under the array substrate in a direction toward the active layer 14 thereby effectively overcoming the issue of photo leakage current induced by light irradiating the active layer 14 of the TFT T, ensuring stable performance of the TFT device, and improving image displaying quality. Further, the active layer 14, the gate insulation layer 15, and the gate terminal 16 of the TFT T are formed by using the same mask so that the number of mask used can be reduced, the manufacturing time is shortened, and the manufacturing efficiency is increased.

Figure 11:
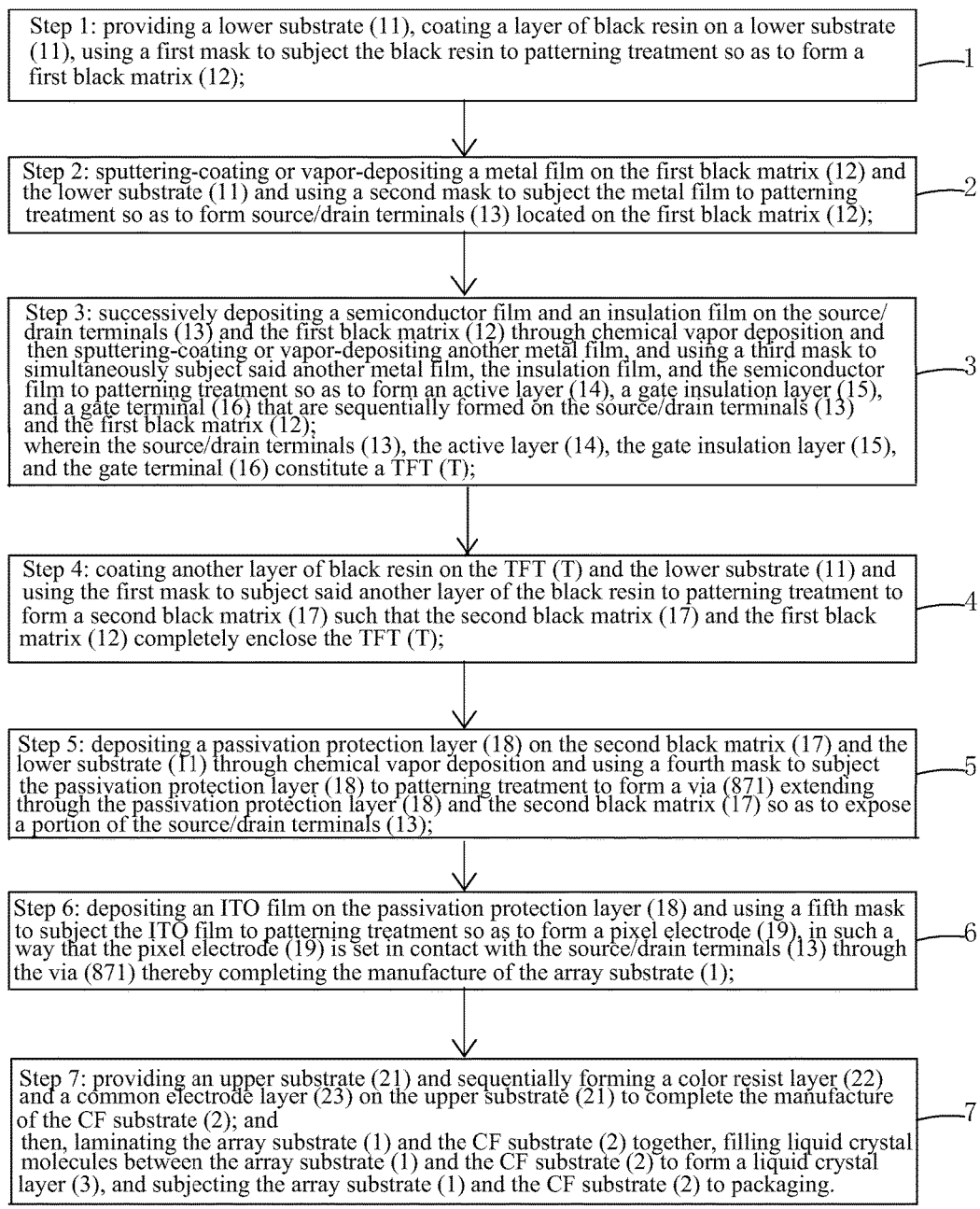
FIG. 11 is a flow chart illustrating a manufacturing method of the BOA liquid crystal according to the second embodiment of the present invention.
Figure 12:
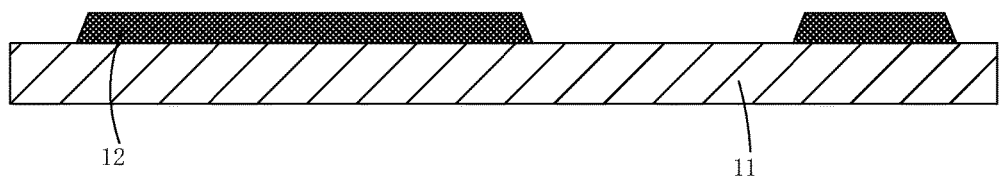
FIG. 12 is a schematic view illustrating a first step of the manufacturing method of the BOA liquid crystal according to the second embodiment of the present invention.

Referring to FIG. 11, which is a flow chart illustrating a manufacturing method of a BOA liquid crystal display panel according to a second embodiment of the present invention. The second embodiment corresponds to a process for manufacturing the BOA liquid crystal display panel shown in FIG. 3 and comprises the following steps:

Step 1: as shown in FIG. 12, providing a lower substrate 11, coating a layer of black resin on the lower substrate 11, using a first mask to subject the black resin to patterning treatment so as to form a first black matrix 12.

Specifically, the lower substrate 11 is preferably a glass substrate. The patterning treatment comprises operations of exposure, development, and etching.

Figure 13:
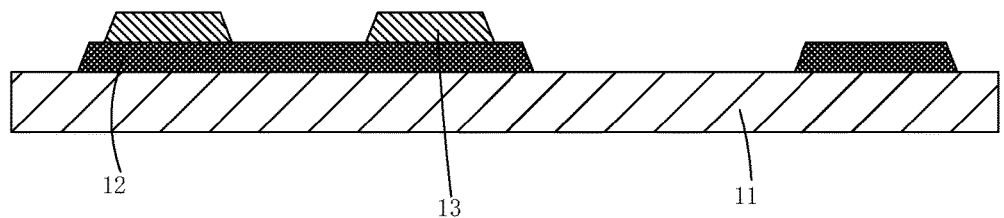
FIG. 13 is a schematic view illustrating a second step of the manufacturing method of the BOA liquid crystal according to the second embodiment of the present invention.

Step 2: as shown in FIG. 13, sputtering-coating or vapor-depositing a metal film on the first black matrix 12 and the lower substrate 11 and using a second mask to subject the metal film to patterning treatment so as to form source/drain terminals 13 located on the first black matrix 12.

Specifically, the metal film, which is the source/drain terminals 13, is formed of a material comprising one of Mo, Ti, Al, Cu, and Ni or a stacked combination of multiple ones thereof. The patterning treatment comprises operations of exposure, development, and wet etching.

Figure 14:
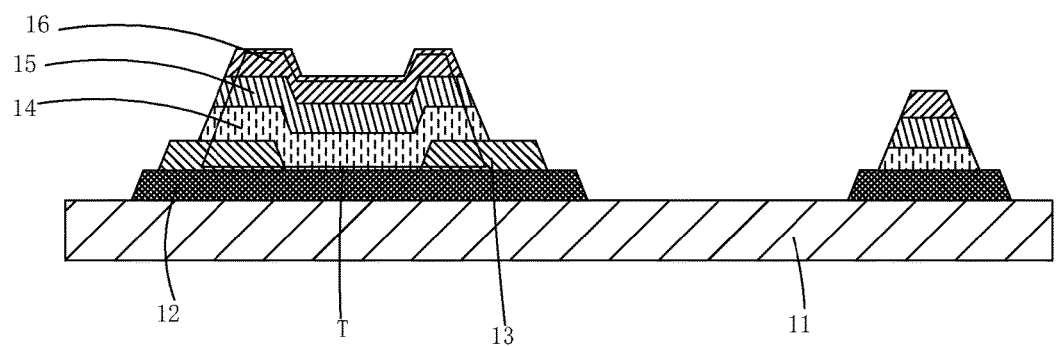
FIG. 14 is a schematic view illustrating a third step of the manufacturing method of the BOA liquid crystal according to the second embodiment of the present invention.

Step 3: as shown in FIG. 14, successively depositing a semiconductor film and an insulation film on the source/drain terminals 13 and the first black matrix 12 through chemical vapor deposition and then sputtering-coating or vapor-depositing another metal film, and using a third mask to simultaneously subject said another metal film, the insulation film, and the semiconductor film to patterning treatment so as to form an active layer 14, a gate insulation layer 15, and a gate terminal 16 that are sequentially formed on the source/drain terminals 13 and the first black matrix 12. The source/drain terminals 13, the active layer 14, the gate insulation layer 15, and the gate terminal 16 collectively constitute a TFT T.

Specifically, the insulation film, which is the gate insulation layer 15, is formed of a material comprising SiOx, SiNx, or a combination thereof. Said anther metal film, which is the gate terminal 16, is formed of a material comprising one of Mo, Ti, Al, Cu, and Ni or a stacked combination of multiple ones thereof. The patterning treatment comprises operations of exposure, development, wet etching, and dry etching.

Figure 15:
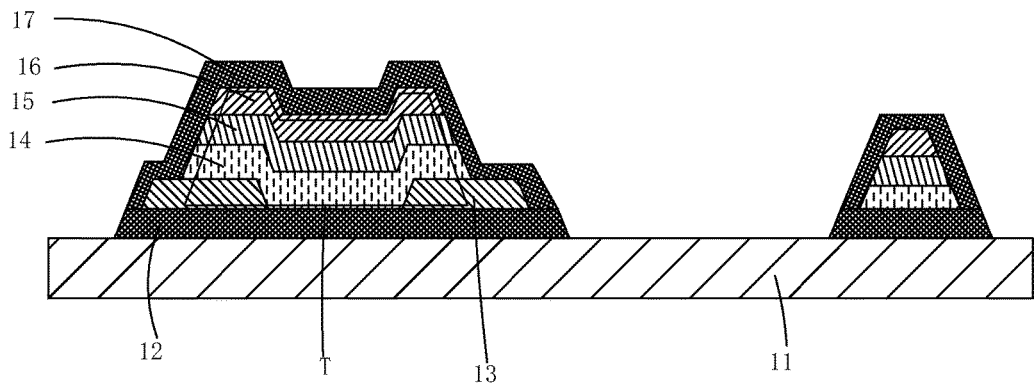
FIG. 15 is a schematic view illustrating a fourth step of the manufacturing method of the BOA liquid crystal according to the second embodiment of the present invention.

Step 4: as shown in FIG. 15, coating another layer of black resin on the TFT T and the lower substrate 11 and using the first mask to subject said another layer of the black resin to patterning treatment to form a second black matrix 17 such that the second black matrix 17 and the first black matrix 12 completely enclose the TFT T.

Figure 16:
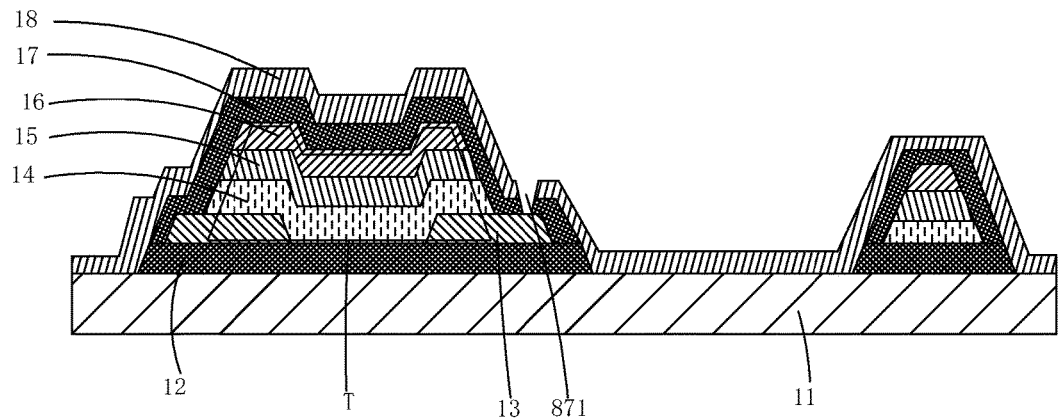
FIG. 16 is a schematic view illustrating a fifth step of the manufacturing method of the BOA liquid crystal according to the second embodiment of the present invention.

Step 5: as shown in FIG. 16, depositing a passivation protection layer 18 on the second black matrix 17 and the lower substrate 11 through chemical vapor deposition and using a fourth mask to subject the passivation protection layer 18 to patterning treatment to form a via 871 extending through the passivation protection layer 18 and the second black matrix 17 so as to expose a portion of the source/drain terminals 13.

Specifically, the passivation protection layer 18 is formed of a material comprising SiOx, SiNx, or a combination thereof. The patterning treatment comprises operations of exposure, development, and dry etching.

Figure 17:
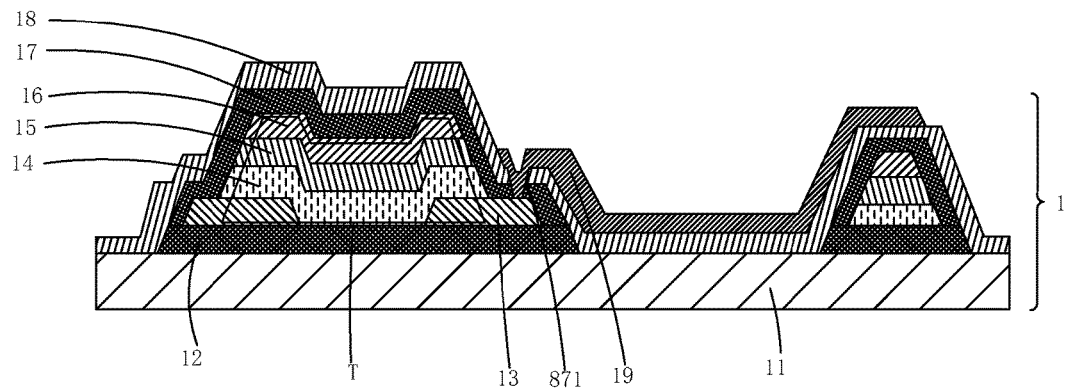
FIG. 17 is a schematic view illustrating a sixth step of the manufacturing method of the BOA liquid crystal according to the second embodiment of the present invention.

Step 6: as shown in FIG. 17, depositing an ITO film on the passivation protection layer 18 and using a fifth mask to subject the ITO film to patterning treatment so as to form a pixel electrode 19, in such a way that the pixel electrode 19 is set in contact with the source/drain terminals 13 through the via 871 thereby completing the manufacture of an array substrate 1.

Specifically, the patterning treatment comprises operations of exposure, development, and etching.

Figure 18:
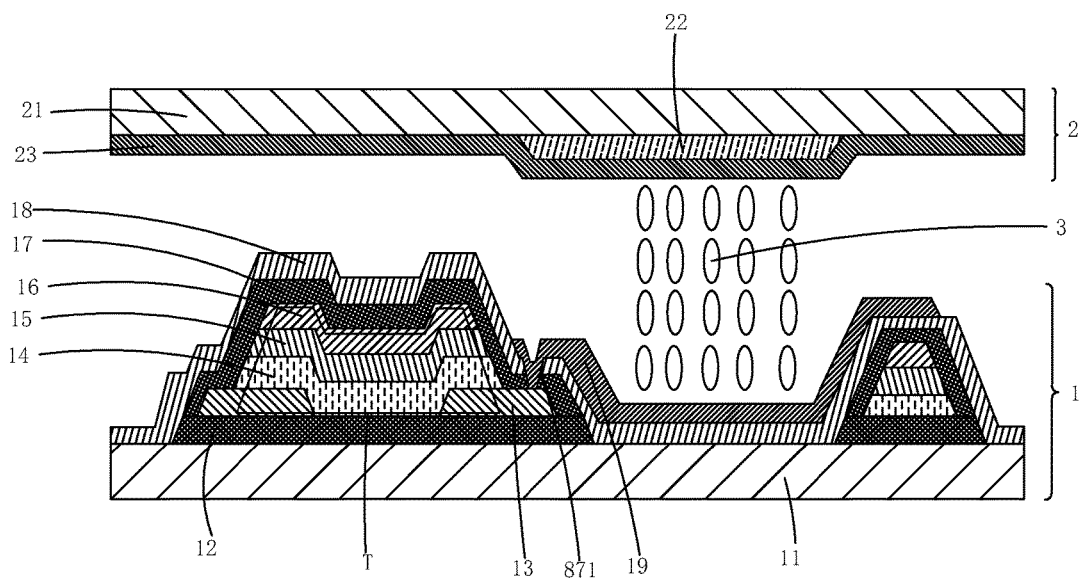
FIG. 18 is a schematic view illustrating a seventh step of the manufacturing method of the BOA liquid crystal according to the second embodiment of the present invention.

Step 7: as shown in FIG. 18, providing an upper substrate 21, sequentially forming a color resist layer 22 and a common electrode layer 23 on the upper substrate 21, and forming a photo spacer (not shown) on the common electrode layer 23 to complete the manufacture of a CF substrate 2; and then, laminating the array substrate 1 and the CF substrate 2 together, filling liquid crystal molecules between the array substrate 1 and the CF substrate 2 to form a liquid crystal layer 3, and subjecting the array substrate 1 and the CF substrate 2 to packaging.

Specifically, the upper substrate 21 is preferably a glass substrate.

In the above-discussed second embodiment of the manufacturing method of a BOA liquid crystal display panel, after the first black matrix 12 is formed on the lower substrate 11 that is on one side of the array substrate 1, the TFT T is formed entirely on the first black matrix 12, and then, the second black matrix 17 is formed on the TFT T so that the second black matrix 17 and the first black matrix 12 completely enclose the TFT T to block light emitting from the backlight module that is located under the array substrate 1 in a direction toward the active layer 14 and also block reflecting light irradiating the active layer 14 from lateral sides and top side to thereby better prevent light irradiating the active layer 14 of the TFT T for preventing photo leakage current, ensuring stable performance of the TFT device, and improving image displaying quality; and further, the active layer 14, the gate insulation layer 15, and the gate terminal 16 of the TFT T are formed by using the same mask and the first black matrix 12 and the second black matrix 17 are formed through using the same mask so that the number of masks used is reduced, the manufacturing time is shortened, and the manufacturing efficiency is increased.

In summary, the present invention provides a BOA liquid crystal display panel, in which a TFT is entirely located on a first black matrix so that the first black matrix blocks light emitting from a backlight module that is located under an array substrate in a direction toward an active layer thereby effectively overcoming the issue of photo leakage current induced by light irradiating the active layer of the TFT. Further, a second black matrix is formed between the TFT and a passivation protection layer such that the second black matrix and the first black matrix completely enclose the TFT to block light emitting from the backlight module that is located under the array substrate in a direction toward the active layer and also block reflecting light irradiating the active layer from lateral sides and top side to thereby better prevent light irradiating the active layer of the TFT for preventing photo leakage current, ensuring stable performance of the TFT device, and improving image displaying quality. The present invention provides a manufacturing method of a BOA liquid crystal display panel, in which after a first black matrix is formed on a lower substrate that is on one side of an array substrate, a TFT is formed entirely on the first black matrix so that the first black matrix blocks light emitting from a backlight module that is located under the array substrate in a direction toward an active layer thereby effectively overcoming the issue of photo leakage current induced by light irradiating the active layer of the TFT, and further, a second black matrix is formed on the TFT so that the second black matrix and the first black matrix completely enclose the TFT to block light emitting from the backlight module that is located under the array substrate in a direction toward the active layer and also block reflecting light irradiating the active layer from lateral sides and top side to thereby better prevent light irradiating the active layer of the TFT for preventing photo leakage current, ensuring stable performance of the TFT device, and improving image displaying quality; and further, the active layer, the gate insulation layer, and the gate terminal of the TFT are formed by using the same mask and the first black matrix and the second black matrix are formed through using the same mask so that the number of masks used is reduced, the manufacturing time is shortened, and the manufacturing efficiency is increased.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A black matrix on array (BOA) liquid crystal display panel, comprising an array substrate and a color filter (CF) substrate opposite to each other and a liquid crystal layer interposed between the array substrate and the CF substrate;
wherein the array substrate comprises a lower substrate, a first black matrix formed of black resin provided on the lower substrate, a thin-film transistor (TFT) that is directly formed on and entirely located on the first black matrix so as to be in direct contact with the first black matrix, a passivation protection layer covering the TFT, the first black matrix, and the lower substrate, and a pixel electrode formed on the passivation protection layer, wherein the TFT comprises source/drain terminals and an active layer that are directly formed on first black matrix and at least partly in direct contact with the first black matrix and the pixel electrode is in contact with the source/drain terminals of the TFT; and
the CF substrate comprises an upper substrate, a color resist layer formed on a surface of the upper substrate that faces the array substrate, and a common electrode covering the color resist layer and the upper substrate.

2. The BOA liquid crystal display panel as claimed in claim 1 further comprising a second black matrix formed between the TFT and the passivation protection layer such that the second black matrix and the first black matrix completely enclose the TFT.

3. The BOA liquid crystal display panel as claimed in claim 1, wherein the TFT is of a top gate structure and comprises the source/drain terminals, the active layer, a gate insulation layer, and a gate terminal that are formed, sequentially from bottom to top, on the first black matrix.

4. The BOA liquid crystal display panel as claimed in claim 2, wherein the TFT is of a top gate structure and comprises the source/drain terminals, the active layer, a gate insulation layer, and a gate terminal that are formed, sequentially from bottom to top, on the first black matrix.

5. The BOA liquid crystal display panel as claimed in claim 3, wherein the pixel electrode is in contact with the source/drain terminals through a via extending through the passivation protection layer.

6. The BOA liquid crystal display panel as claimed in claim 4, wherein the pixel electrode is in contact with the source/drain terminals through a via extending through the passivation protection layer and the second black matrix.

7. A black matrix on array (BOA) liquid crystal display panel, comprising an array substrate and a color filter (CF) substrate opposite to each other and a liquid crystal layer interposed between the array substrate and the CF substrate,
wherein the array substrate comprises a lower substrate, a first black matrix formed of black resin provided on the lower substrate, a thin-film transistor (TFT) that is directly formed on and entirely located on the first black matrix so as to be in direct contact with the first black matrix, a passivation protection layer covering the TFT, the first black matrix, and the lower substrate, and a pixel electrode formed on the passivation protection layer, wherein the TFT comprises source/drain terminals and an active layer that are directly formed on first black matrix and at least partly in direct contact with the first black matrix and the pixel electrode is in contact with the source/drain terminals of the TFT, and
the CF substrate comprises an upper substrate, a color resist layer formed on a surface of the upper substrate that faces the array substrate, and a common electrode covering the color resist layer and the upper substrate; and
further comprising a second black matrix formed between the TFT and the passivation protection layer such that the second black matrix and the first black matrix completely enclose the TFT;
wherein the TFT is of a top gate structure and comprises the source/drain terminals, the active layer, a gate insulation layer, and a gate terminal that are formed, sequentially from bottom to top, on the first black matrix; and
wherein the pixel electrode is in contact with the source/drain terminals through a via extending through the passivation protection layer and the second black matrix.

* * * * *